United States Patent
Scarlete et al.

(10) Patent No.: US 7,396,563 B2
(45) Date of Patent: Jul. 8, 2008

(54) CERAMIC THIN FILM ON VARIOUS SUBSTRATES, AND PROCESS FOR PRODUCING SAME

(75) Inventors: Mihai Scarlete, Roxboro (CA); Cetin Aktik, Sherbrooke (CA)

(73) Assignee: Sixtron Advanced Materials, Inc., Quebec (CA)

( * ) Notice: Subject to any disclaimer, the term of this patent is extended or adjusted under 35 U.S.C. 154(b) by 307 days.

(21) Appl. No.: 10/515,450
(22) PCT Filed: May 23, 2003
(86) PCT No.: PCT/CA03/00763

§ 371 (c)(1),
(2), (4) Date: Jun. 24, 2005

(87) PCT Pub. No.: WO03/100123

PCT Pub. Date: Dec. 4, 2003

(65) Prior Publication Data

US 2005/0241567 A1 Nov. 3, 2005

(30) Foreign Application Priority Data

May 23, 2002 (CA) ................................. 2387274

(51) Int. Cl.
C23C 16/00 (2006.01)
C23C 16/22 (2006.01)
(52) U.S. Cl. .................. 427/248.1; 427/255.23; 427/255.28; 427/255.38; 427/255.394
(58) Field of Classification Search .............. None
See application file for complete search history.

(56) References Cited

U.S. PATENT DOCUMENTS 5,028,571 A * 7/1991 Pillot et al. ............... 501/96.2
5,126,168 A * 6/1992 Sneddon et al. ........... 427/226
5,165,955 A * 11/1992 Gentle ...................... 427/575
5,354,506 A * 10/1994 Niebylski ............... 252/389.31
5,489,707 A * 2/1996 Sneddon et al. ............. 564/10

(Continued)

FOREIGN PATENT DOCUMENTS

EP 0970267 10/1998

OTHER PUBLICATIONS

He et al. Silicon nitride carbonitride by the pyrolysis of poly(methylsiladiazane). J. Am. Ceram. Soc. 78(11) pp. 3009-3017☐☐.*

(Continued)

*Primary Examiner*—Timothy Meeks
*Assistant Examiner*—Kelly M Stouffer
(74) *Attorney, Agent, or Firm*—RatnerPrestia (57) ABSTRACT

The process of Polymer Assisted Chemical Vapor Deposition (PACVD) and the semiconductor, dielectric, passivating or protecting thin films produced by the process are described. A semiconductor thin film of amorphous silicon carbide is obtained through vapor deposition following desublimation of pyrolysis products of polymeric precursors in inert or active atmosphere. PA-CVD allows one or multi-layers compositions, microstructures and thicknesses to be deposited on a wide variety of substrates. The deposited thin film from desublimation is an n-type semiconductor with a low donor concentration in the range of $10^{14}$-$10^{17}$ cm$^{-3}$. Many devices can be fabricated by the PA-CVD method of the invention such as; solar cells; light-emitting diodes; transistors; photothyristors, as well as integrated monolithic devices on a single chip. Using this novel technique, high deposition rates can be obtained from chemically synchronized Si—C bonds redistribution in organo-polysilanes in the temperature range of about 200-450° C.

17 Claims, 8 Drawing Sheets

U.S. PATENT DOCUMENTS

| | | | |
|---|---|---|---|
| 5,952,046 | A | 9/1999 | Chayka |
| 6,045,877 | A * | 4/2000 | Gleason et al. ............. 427/522 |
| 6,270,573 | B1 | 8/2001 | Kitabatake |
| 6,572,923 | B2 * | 6/2003 | Ma et al. ............... 427/255.27 |
| 6,599,584 | B2 * | 7/2003 | Plester et al. ............... 427/488 |
| 6,730,802 | B2 | 5/2004 | Shen et al. |
| 6,838,124 | B2 * | 1/2005 | Hacker ....................... 427/551 |

OTHER PUBLICATIONS

Mittov et al. "CVD of Silicon Oxynitride films onto silicon by the pyrolysis of hexamethyl disilazane with nitrogen-containing additives." Russian Microelectronics, (Jan. 2002), 31(1) 13-20☐☐☐☐.*

Jiliang He et al., Silicon Nitride and Silicon Carbonitride by the Pyrolysis of Poly(methylsiladiazane), J. Am. Ceram. Soc., 78(11), 3009-3017 (1995).

Mihai Scarlete et al., Poly(methylsilane) and Poly(hydrazinomethylsilane), as Precursors for Silicon-Containing Ceramics, Applications of Organometallic Chemistry in the Preparation and Processing of Advanced Materials, eds. J.F. Harrod and R.M. Laine, 125-140 (1995).

Sanela Matric et al., Spectroscopic Analysis and Semiconductor Properties of Amorphous Thin Films Containing Silicon-Carbon-Nitrogen Desposited via a Polymeric Route, Canadian Journal of Analytical Sciences and Spectroscopy, 48(1), 1-8 (2003).

Mihai Scarlete et al., Spectroscopic Investigation of the Thin Silicon Nitride Films on Silicon Single-Crystal Wafers via Ammonia-Assisted Pyrolysis of Organosilicon Polymers, Chem. Mater., 13,655-661 (2001).

Mihai Scarlete et al., Nitrogenation of Silicon Carbide Layers Deposited on Silicon Single-Crystal Wafers via Pyrolysis of Poly(methylsilane), Chem. Mater., 7, 1214-1220 (1995).

Mihai Scarlete et al., Infrared Spectroscopic Study of Thin Films of Poly(methylisane), Its Oxidation, and Its Transformation into Poly(carbolisane) on the Surfaces of Silicon Single-Crystal Wafers, Chem., Mater., 6,977-982 (1994).

Mittov, O et al., "Chemical vapor deposition of silicon oxynitride films onto silicon by the pyrolysis of hexamethyl disilazane with nitrogen-containing additives", Russian Microelectronics (Translation of Mikroelektronika) (2002), 31(1), 13-20.

Scarlete, M. et al., "Nitrogenation of Silicon Carbide Layers Deposited on Silicon", Chemistry of Materials (1995), 7(6), 1214-20.

"F1188-00 Standard Test Method for Interstitial Atomic Oxygen Content of Silicon by Infrared Absorption", ASTM International, referenced ASTM standard on ASTM website, www.astm.org.

Budaguan, B.G. et al. "The development of a high-rate technology for wide-bandgap photosensitive a-SiC:H alloys" *Journal of Alloys and Compounds*, 327 (2001) pp. 146-150.

Cao, Feng et al. "Modification of Polycarbosilane as a Precursor with High Ceramic Yield for Oxygen-Free SiC Fibers" *Korean J. Chem. Eng.*, 18(5) (2001) pp. 761-764.

Christidis, T. et al. "Comparative EPR study of hydrogenated and unhydrogenated amorphous silicon carbide thin films" *Applied Surface Science* 184 (2001) pp. 268-272.

Grigoriev, D.A. et al. "Preparation of silicon carbide by electrospraying of a polymeric precursor" *Philosophical Magazine Letters* (2001) vol. 81, No. 4, pp. 285-291.

Jana, T. et al., "Doping of p-type microcrystalline silicon carbon alloy films by the very high frequency plasma enhanced chemical vapor deposition technique" Journal of Materials Research, 16(7), (2001) pp. 2130-2135.

Lau, S.P. et al. "Dependences of amorphous structure on bias voltage and annealing in silicon-carbon alloys" *Materials Science and Engineering B85* (2001) pp. 20-24.

Maya, L. "Plasma-enhanced chemical vapor deposition of boron nitride using polymeric cyanoborane as source" *Journal of the American Ceramic Society*, vol. 75, No. 7, (Jul. 1992) pp. 1985-1987.

Mogensen, Klaus B. et al. "Ultraviolet transparent silicon oxynitrate waveguides for biochemical microsystems" *Optics Letters* vol. 26, No. 10, pp. 716-718.

Pola, Josef "Laser Gas-Phase Photolysis of Organosilicon Compounds: Approach to Formation of Hydrogenated Si/C, Si/C/f, Si/C/O and Si/0 Phases" *PINSA*, 66 A, No. 1 (Jan. 2000) pp. 107-136.

Scarlete, Mihai "Mechanism of Carbon and Oxygen Incorporation in Silicon Single Crystals Grown by the Czochralski (Cz) Technique" *J. Electrochem. Soc.*, vol. 139, No. 4 (Apr. 1992 pp. 1207-1212.

Schroder, D.K. Chapter 2- "Carrier and Doping Concentration" Semiconductor Materials and Device Characterization, Wiley Interscience (1999) pp. 41-98).

Scopel, W.L. et al. "Theoretical and experimental studies of the atomic structure of oxygen-rich amorphous silicon oxynitrate films" *Physical Review B*, 68, 155332-1, pp. 1-6.

Shina, K. et al. "Thermal Rearrangement of Hexamethyldisilane to Trimethyl(dimethylsilymethyl)-silane" J. Org. Chem. (1958) 23, pp. 139.

Stachowicz, L. et al. "Synthesis of ultrafine SiC from rice hulls (husks): a plasma process" Plasma Chemistry and Plasma Processing, vol. 13, No. 3, (1993) pp. 447-461.

Van Der Pauw, L.J. "A Method of Measuring the Resistivity and Hall Coefficient on Lamellae of Arbitrary Shape" *Philips Technical Review*, vol. 20, (1958) pp. 220-224.

Van Der Pauw, L.J., Philips Research Reports, 13 (1958) pp. 1-9.

Wang, Yihua et al. "High temperature annealing of hydrogenated amorphous silicon carbide thin films" *Thin Solid Films* 384 (2001) pp. 173-176.

Weast, R.C. "Ionization Potentials of Molecules" *CRC Handbook of Chemistry and Physics*, (1990) pp. E-93-E-94.

Yamamoto, K. et al. "XPS studies of amorphous SiCN thin films prepared by nitrogen ion-assisted pulsed-laser deposition of SiC target" *Diamond and Related Materials*, 10 (2001) pp. 1921-1926.

Yang, L. et al. "Synthesis of SiC Using Ion Beam and PECVD" 1998 5th International Conference on Solid-State and Integrated Circuit Technology, pp. 811-814.

Yoon, S.F. et al. "Application of electron cyclotron resonance chemical vapour deposition in the preparation of hydrogenated SiC films: a comparison of phosphorus and boron doping" Journal of Alloys and Compounds, 261, (1997) pp. 281-288.

* cited by examiner

CERAMIC THIN FILM ON VARIOUS SUBSTRATES, AND PROCESS FOR PRODUCING SAME

CROSS REFERENCE TO RELATED APPLICATIONS

This is the National Phase of International Application No. PCT/CA03/000763, filed May 23, 2003, which was published in English under PCT Article 21(2), and which is incorporated herein in its entirety.

FIELD OF THE INVENTION

The present invention relates to a ceramic thin film which may be an amorphous silicon carbide (a-SiC) semiconductor thin film deposited on various substrates suitable for photovoltaic cells and a variety of relatively high performance low-cost electronic devices which can be easily and economically mass-manufactured. By means of Polymer-Assisted Chemical Vapor Deposition (PA-CVD), new semiconductor materials with high conversion yields can be produced at low cost. The process involves gaseous precursors from polymeric sources, which lead to chemically synchronized construction of a desirable amorphous silicon carbide structural framework with special electronic and photonic properties.

BACKGROUND OF THE INVENTION

Kitabatake et al., disclose in U.S. Pat. No. 6,270,573 B1, CVD and CVD-related methods of producing silicon carbide substrates, including the growing of silicon carbide film by supplying separate silicon atoms and carbon atoms on a surface. The silicon-carbon bond formation occurs mainly on the surface of the substrate, a step that usually requires high temperatures, in this particular case the required temperature being 1300° C. MBE and MO-CVD may use species that contain a limited number of pre-existing Si—C bonds in the precursor, this number being usually related to precursor synthesis requirements.

Kong et al. (European Patent No. EP 0,970,267) describe a susceptor design for silicon carbide resulting in minimizing or eliminating thermal gradients between the two surfaces of a substrate wafer. The CVD and CVD-related deposition procedures of Kong et al., require strict control of the temperature field and the gas flow at the surface of the substrate, where the Si—C bond formation is occurring.

Grigoriev et al. (Grigoriev, D. A., Edirisinghe, M. J., Bao, X., Evans, J. R. G. and Luklinska, Z. B.(2001) "Preparation of silicon carbide by electrospraying of a polymeric precursor," Philosophical Magazine Letters (UK), 81, 4, 2001 by Dept. of Mater., Queen Mary Univ. of London, UK) present silicon carbide coatings and films prepared for the first time by electrostatic atomization of a solution of a polymeric precursor and deposition onto alumina and zirconia substrates. In the method of Grigoriev et al., the polymeric source already contains most of the Si—C bonds required for the formation of the SiC film; however, the molecular source is carried to the surface inside cages of solvent molecules, implicitly leading to contamination of the film, shrinking and outgassing phenomena, due to solvent evaporation and polymer cracking. These effects will be present in any polymer-assisted method (spin-coating, spraying, laser ablation . . . ).

Lau et al. (Lau, S. P., Xu, X. L., Shi, J. R., Ding, X. Z., Sun, Z. and Tay, B. K. (2001) "Dependences of amorphous structure on bias voltage and annealing in silicon-carbon alloys," Materials Science & Engineering, B85 (16), Sch. of Electr. & Electron. Eng., Nanyang Technol. Inst., Singapore) report on amorphous silicon-carbon alloy films that have been obtained by filtered cathodic vacuum arc (FCVA) technique. They have observed that the disorder of the Si—C network increased with using the high bias voltages during the deposition. This high disorder in the film with high bias voltages induces the smaller nanometer crystallites after annealing at 1000° C. rather than low bias. The Raman peaks shift to the high frequency with increasing the annealing temperature up to 750° C. due to the increase of nanometer grain size at the same bias. A sharp transition from nanocrystalline to polycrystalline can be observed when the films are annealed under 1000° C.

Jana of al. (Jana, T., Dasgupta, A. and Ray, S. (2001) "Doping of p-type microcrystalline silicon carbon alloy films by the very high frequency plasma-enhanced chemical vapor deposition technique" Journal of Materials Research, 16(7) 2001, 2130-5, Energy Res. Unit, Indian Assoc. for the Cultivation of Sci., Calcutta, India) present the synthesis of p-type silicon-carbon alloy thin films by very high frequency plasma-enhanced chemical vapor deposition technique using a $SiH_4$, H2, $CH_4$, and $B_2H_6$ gas mixture at low power (55 $mW/cm^2$) and low substrate temperatures (150-250° C.). Effects of substrate temperature and plasma excitation frequency on the optoelectronic and structural properties of the films were studied. A film with conductivity 5.75 $Scm^{-1}$ and 1.93 eV optical gap $E_{04}$ was obtained at a low substrate temperature of 200° C. using 63.75 MHz plasma frequency. The crystalline volume fractions of the films were estimated from the Raman spectra. They observed that crystallinity in silicon carbon alloy films depends critically on plasma excitation frequency. When higher power (117 $mW/cm^2$) at 180° C. with 66 MHz frequency was applied, the deposition rate of the film increased to 5.07 nm/min without any significant change in optoelectronic properties.

Yamamoto et al. (Yamamoto et al., Diam. Relat. Mater., vol. 10 (no. 9-10), 2001, pp. 1921-6) present a doping procedure whereby amorphous SiCN films were prepared on Si (100) substrates by nitrogen ion-assisted pulsed-laser ablation of a SiC target. The dependence of the formed chemical bonds in the films on nitrogen ion energy and the substrate temperature was investigated by X-ray photoelectron spectroscopy (XPS). The fractions of $sp^2$ C—C, $sp^3$ C—C and $sp^2$ C—N bonds decreased, and that of N—Si bonds increased when the nitrogen ion energy was increased without heating during the film preparation.

The fraction of sp C—N bonds was not changed by the nitrogen ion irradiation below 200 eV. Si atoms displaced carbon atoms in the films and the $sp^3$ bonding network was made between carbon and silicon through nitrogen. This tendency was remarkable in the films prepared under substrate heating, and the fraction of $sp^3$ C—N bonds also decreased when the nitrogen ion energy was increased. Under the impact of high-energy ions or substrate heating the films consisted of $sp^2$ C—C bonds and Si—N bonds, and the formation of $Sp^3$ C—N bonds was difficult. The Yamamoto procedure proposes a doping step separate from the synthesis step.

Budaguan et al. (Budaguan, B. G.; Sherchenkov, A. A.; Gorbulin, G. L.; Chernomordic, V. D. (2001) "The development of a high rate technology for wide-bandgap photosensitive a-SiC:H alloys," Journal of Alloys and Compounds, 327(30) Aug., 146-50, Inst. of Electron Technol., Moscow, Russia) discuss in their paper the deposition process and the properties of a-SiC:H alloy fabricated for the first time by 55 kHz PECVD. It was found that 55 kHz PECVD allows an increase in the deposition rate of a-SiC:H films.

Modiano et al. (Japanese patent No. 145138/95) present a process for producing silicon carbide fibers having a C/Si molar ratio from 0.85 to 1.39, comprising the steps of rendering infusible the precursory fibers made from an organosilicon polymer compound, then primarily baking the infusible fibers in a hydrogen gas-containing atmosphere. This process for producing silicon carbide thin films comprises the steps of imparting semiconductor properties to passivating or dielectric thin films from volatile precursory species produced from organosilicon polymer compounds.

Yang et al. (Yang, Lixin; Chen, Changqing; Ren, Congxin; Yan, Jinlong; Chen, Xueliang, "Synthesis of SiC Using Ion Beam and PECVD", International Conference on Solid-State and Integrated Circuit Technology Proceedings, pp. 811-814) present a process for producing silicon carbide thin films comprising the steps of conferring semiconductor properties to passivating or dielectric thin films from volatile precursory species produced from organosilicon polymeric compounds.

DISCLOSURE OF THE INVENTION

An object of the present invention is therefore to provide a method of depositing a thin ceramic film on an appropriate substrate.

Another object of the present invention is to provide a ceramic thin film deposition on a substrate.

It is a further object is to provide a semiconductor device comprising the film according to invention.

In accordance with one embodiment of the invention there is provided a method of depositing a thin ceramic film onto a substrate comprising: providing a polymeric source; providing the substrate; heating the polymeric source under a gaseous atmosphere having a pressure and a flowrate, whereby pyrolyzing the polymeric source to produce a gaseous precursor at a first temperature comprising chains of the polymeric source; positioning the substrate to receive the gaseous precursor carried by the gaseous atmosphere; and cooling the substrate at a second temperature below the first temperature whereby desublimating the gaseous precursor onto the substrate, the precursor chemically rearranging and annealing to produce the film on the substrate, the film having properties that include an amorphous nature, a crystallinity and a degree of reticulation.

In accordance with another embodiment of the invention there is provided a ceramic thin film deposited on a substrate comprising chains from a polymeric source that have been deposited on the substrate and chemically rearranged and annealed wherein the film is essentially free of defects.

Other objects, advantages and features of the present invention will become more apparent upon reading of the following non-restrictive description of preferred embodiments thereof, given by way of example only with reference to the accompanying drawings.

DESCRIPTION OF THE PREFERRED EMBODIMENT

The present description refers to a number of documents, the content of which is herein incorporated by reference in their entirety.

An aspect of the present invention is concerned with an innovative method of forming volatile pyrolysis products from Si-based polymeric compounds or sources. These sources can be used to form gaseous precursors to thin films of ceramic materials in silicon-carbon-nitrogen-oxygen systems that can be deposited on commonly available substrates as a completely to partially amorphous semiconductor, at a desired micron-range thickness, onto a variety of commonly available and resistant substrates of varying composition, degree of stiffness, shape, density, color, etc., over a small to an exceptionally large surface. This method is herein called Polymer-Assisted Chemical Vapor Deposition (PA-CVD). The thin films produced by the method will be durable, may be flexible (due to their thinness), and can be used for high-performance semi-conductors. The film may be deposited on a small as well as a large surface substrates. The substrates can be rigid or highly flexible and of various composition, shape, thickness and color.

According to the present invention, during PA-CVD (Polymer Assisted-Chemical Vapor Deposition), most of the Si—C bonds required for the formation of the silicon carbide structure pre-exist in the polymeric source. Because most of the Si—C bonds pre-exist in the polymeric source and gaseous precursor produced therefrom, the temperature requirements become more flexible, allowing lower temperatures and expanded operational range. For this reason the nature of the substrate is less important, in terms of thermal stability, size or shape. More than 50% of the SiC bonds pre-exist in the polymeric precursor. Furthermore, the gaseous precursor is deposited in chemical chains, similar to physical chains, that then rearrange and bind to one another. The bond formed between the precursor and the substrate is a van der Waals physical bond.

The PA-CVD method of the present invention further distinguishes itself from other forms of CVD because it does not require solvent molecules to dissolve the precursor, the evaporation of these solvents in other CVD methods produces defects on the surface of the coating they produce, this is one reason why the PA-CVD method produces films with fewer and essentially no surface defects.

PA-CVD further allows the polymeric source to self-adjust to the temperature field because each polymeric source will develop a set of gaseous precursors adapted to the particular thermal conditions (various gradients and temperature-cycles produce different gaseous precursors, thermodynamically stable under the specific conditions). This self adjustment is different for different polymeric sources. The net result is that PA-CVD produces pure gaseous precursors, containing a maximum number of pre-existing Si—C bonds thermodynamically stable in the local existing conditions, thus minimizing the extent of the chemical reaction required for completion of the silicon carbide structure at the surface of the substrate. In this process, the polymer pyrolysis mechanisms naturally leave in the solid residue the usually larger molecular weight species containing adventitious oxygen (such as siloxane species), while the gaseous precursors reaching the substrate are less contaminated.

The PA-CVD of the present invention allows reduced deposition temperatures because a majority of the Si—C bonds pre-exist in the precursor. PA-CVD also uses in-situ doping (N, P, As, B, . . . containing gas-phase species that react chemically with the precursor before deposition) allowing in-situ determination of the dopant concentration and monitoring of the formation of dopant-containing species (aminosilane formation via IR spectroscopy could be performed directly in the quartz reactor). PA-CVD locks the carbon atoms in a $sp^3$ hybridization state process of the present invention. PA-CVD allows significantly higher deposition rates when used on very large substrates as compared with the a-SiC films produced by any other CVD-related method, including that taught by the aforementioned Budaguan et al.

The PA-CVD process according to the present invention:
1) allows for the hydrogenation, heat treatment and makes full use of many different types of gaseous reactants such as, $B_2H_6$, $NH_3$, $PH_3$, $AsH_3$, $BCl_3$, $B_2Cl_6$, $NCl_3$, $PCl_3$, $AsCl_3$, CO, $O_2$, $O_3$, CO, $CO_2$, as well as $H_2$ pure or inert carried gases such as Ar or $N_2$, or similar mixtures, with the inert gases varying from 0.1 to 99.0 % in volume;
2) can accommodate a wide variety of heat sources and treatment lengths for the polymeric precursors or for the deposited film under the gaseous atmospheres, for as little as 1 second and up to, but not limited to, tens of hours, and leading to a wide variety of passivating, semiconductor, and dielectric thin film materials;
3) allows secondary annealing under $BH_3$, $B_2H_6$, $NH_3$, $PH_3$, $AsH_3$, $BCl_3$, $B_2Cl_6$, $NCl_3$, $PCl_3$, $AsCl_3$, CO, $O_2$, $O_3$, CO, $CO_2$ or $H_2$ gases for several seconds, thereby increasing the crystallinity and/or the degree of reticulation of the deposited film;
4) the PA-CVD process can make good use of standard heating methods as well electronic beams, X-rays, UV and IR radiation microwave power, laser beams and other energy transfer mechanisms to produce objects and substrates in flat, or tubular or complex shapes including, but not restricted to, rods, cylinders, spheres, ceramic boats, etc.; and
5) produces substrates with varying conductor, semiconductor or dielectric properties, including, but not restricted to polycrystalline or amorphous silicon; quartz; graphite; metals; electronic-grade or refractive ceramic materials, such as alumina or sintered oxides, nitrides, phosphides;.as well as $A_2B_6$, $A_3B_5$, ternary and quaternary compounds in this class.

The PA-CVD process does not require massive silicon-carbon bond formation on the surface of the substrate, since most of the existing Si—C network in the amorphous phase is obtained via massive Si—C bond redistribution during processes preceding the deposition of the thin film.

The PA-CVD design allows the use of a broad series of polymeric precursors for use in the synthesis of silicon-based thin films including, but not limited to, oxides, nitrides, carbides and variously weighted combinations in homogeneous phases or multi-layered structures. The resulting films are of considerable interest as electronic and optoelectronic materials as well as for protective coatings. A large variety of appropriate silicon-based polymeric sources can be used, such as polysilanes, polycarbosilanes, polycarbosilazanes, polysiloxanes and polysiloxazanes. Other appropriate polymeric sources include: carbon nitride polymeric sources and boron nitride polymeric sources which too have been found to produce useful ceramic products. The possible carbon nitride polymeric sources (CxNy) include: polyepoxy-, polyamides, polyamines, polyimides, polyureas and polyurethanes. It is noted that polyamides, polyamines, polyimides and polyureas can be used in mixtures with the other polymeric sources and as a possible source of nitrogen in the reaction. Polymers sources with other backbones can be envisaged comprising: Al, B, Ge, Ga, P, As, N, In, Sb, S, Se, Te, In and Sb.

By means of p-n homo- or heterojunctions and using a variety of flexible or rigid substrates, it is possible to fabricate solar cells, light-emitting diodes, transistors, photothyristors, and similar devices. Using high breakdown electrical field and high electron saturation velocity, it is further possible to produce high frequency, high power and high temperature electronic and optoelectronic devices. By combining optical and electronic properties, the materials may also serve to fabricate integrated monolithic devices on a single chip.

The PA-CVD process is relatively simple requiring only a driving force generated in the furnace (2), being the supersaturation ratio obtained in a temperature gradient field. Furthermore, PA-CVD distinguishes itself from other forms of chemical vapor deposition because it does not require the following more sophiscated driving forces:
a) ion implantation, ion beam enhanced deposition, reactive ion beam sputtering and plasma enhanced chemical vapor deposition (PECVD);
b) RF power (as described in "High temperature annealing of hydrogenated amorphous silicon carbide thin films" INS 01-17 6910830 A2001-11-6855-060 (PHA) NDN-174-0691-0829-5 Yihua Wang; Jianyi Lin; Cheng Hon Alfred Huan; Zhe Chuan Feng; Soo Jin Chua);
c) IR and UV laser photolysis (as described in "Laser gas-phase photolysis of organosilicon compounds: approach to formation of hydrogenated Si/C, Si/C/F, Si/C/O and Si/O phases" INS 00-50 6791677 A2001-03-8250F-001 (PHA) NDN-174-0679-1676-1 Pola, J. JOURNAL NAME-PINSA-A (Proceedings of the Indian National Science Academy) Part A (Physical Sciences)); and
d) electron cyclotron resonance (as described in "Application of electron cyclotron resonance chemical vapor deposition in the preparation of hydrogenated SiC films. A comparison of phosphorus and boron doping" INS 98-04 5814339 A98058115H-021 (PHA); B9803-0520F-017 (EEA) NDN-174-0581-4338-2 Yoon, S. F.; Ji, R.).

Figure 1A:
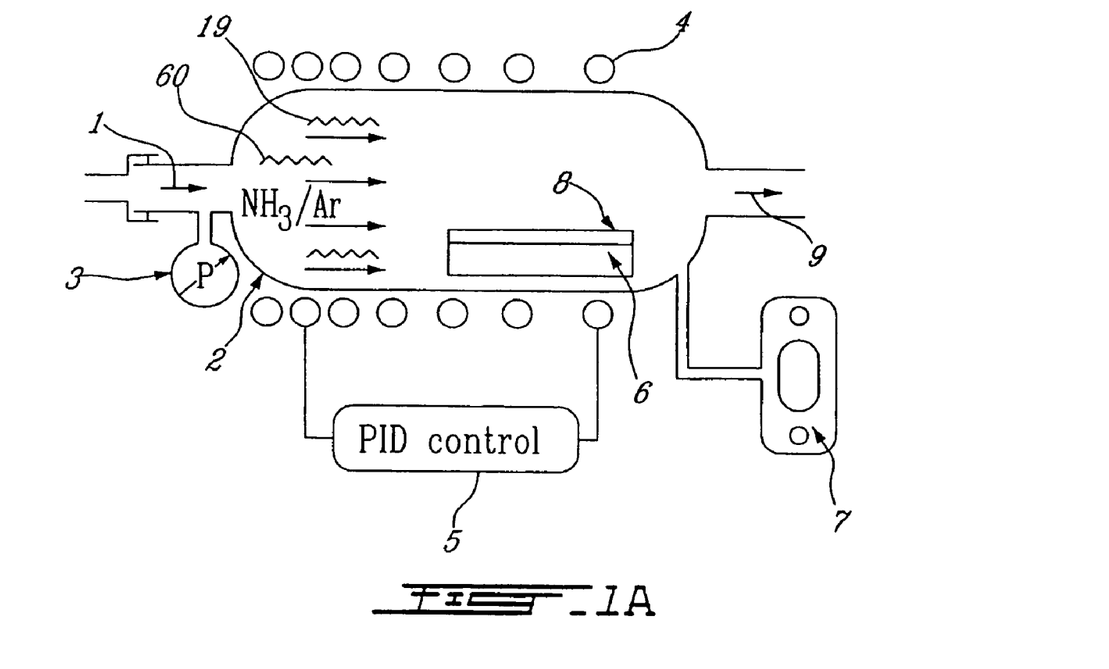
FIG. 1a is a schema of the Polymer-Assisted Chemical Vapor Deposition reactor.
Figure 1B:
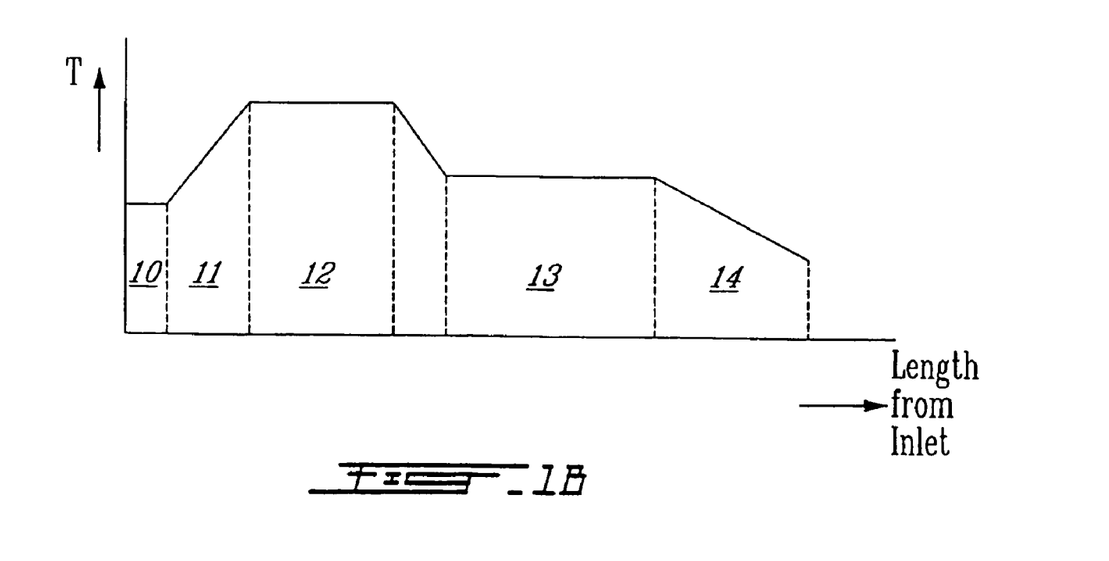
FIG. 1b is a temperature-profile in the reactor versus the distance from the gas input.

An reactor (2), for PA-CVD is illustrated in FIG. 1a which shows the principal characteristics of a reactor that can be used for PA-CVD, while FIG. 1b illustrates the varying temperature profile within the PA-CVD reactor.

Referring to FIG. 1A, there is a quartz reactor (2), into which one or several polymer derived precursors (19), enter through gas inlet (1). The quartz reactor (2) is also referred to as the furnace or the PA-CVD reactor. Furthermore, a gaseous atmosphere (60), either inert or active, also enters through the gas inlet (1). The inert atmosphere includes argon, nitrogen or other inert gases. While the active atmosphere includes gases such as ammonia, carbon monoxide or similar gases. Before operation the reactor (2) is purged with a selected atmosphere (60).

The gas inlet (1), has a high-vacuum seal to minimize the ingress of oxygen impurities from the surrounding air drawn into the reactor (2). The total pressure in the reactor is measured with a pressure controller (3) which also controls the flowrate into the reactor (2). The outside of the reactor is heated with electric heating elements (4), which surround the PA-CVD reactor (2) to produce the temperature gradient illustrated in FIG. 1b. There are more heating elements (4) near the inlet of the reactor (2), while there are fewer surrounding the deposition area of the reactor. The PID (Proportional-Integral-Derivative) temperature controller (5), ensures that the temperature within the reactor (2) is in the appropriate range for the polymer-derived precursor (19) used, the type of gaseous atmosphere (60) and substrate (6) to be coated. The substrate (6), is placed in the deposition area of the reactor (2). Typically the substrate (6), is a piece or part made of silicon, quartz, metal, ceramics, etc. The gas phase near the gas outlet (9), of the reactor (2), is analyzed by an FT-IR (Fourier Transform InfraRed) spectrometer (7). The FT-IR spectrometer (7), allows the in situ verification of the deposition process and the oxygen impurities present. A SiC film (8) is deposited on the substrate (6) through the decomposition of the silicon based polymeric sources (19) and their chemical rearrangement to SiC on the surface of the substrate (6). The deposited film (8) can be a single or multiple layered film.

Referring to FIG. 1B, the temperature profile within and along the length of the reactor (2) is represented. The input zone (10) shows a constant lower temperature associated with the gas inlet (1). In the heating zone (11), there is a increase in the temperature due to the large amount of heating elements (4) at the inlet. In the heating zone (11), the rearrangement of the silicon based polymeric sources occurs which leads to the formation of the poly(carbosilane) species. The next temperature is that of the pyrolysis zone (12), where there is direct precursor formation and doping occurring. This is followed by a reduction in the number of heating elements (4) in the deposition zone (13) which consequently cools the particularly zone of the reactor (2) thus lowering the temperature. The deposition zone (13) is represented by a constant temperature while the SiC is being deposited on the substrate (6). Finally there is the gas exit zone (14), where the temperature falls in the gas outlet (9) of the reactor (2) and approaches that of the ambient temperature outside the reactor (2). The temperatures in the reactor (2) and represented in FIG. 1B, vary from 100 to 1000° C. In a preferred embodiment the PA-CVD temperature zone varies from 200 to 450° C.

The PA-CVD process and resulting materials produced are based on the innovative design and directed behaviour of volatile, relatively large molecular mass, gaseous precursors derived from silicon-based polymeric sources. This PA-CVD synthesis of inorganic thin silicon-based films includes silicon carbide, silicon nitride, silicon oxide, silicon oxycarbide, silicon oxynitride, silicon oxycarbonitride and other such materials, in pure and doped forms.

The tolerance of the polymeric source to depolymerization processes is related directly to silicon-carbon, silicon-nitrogen and silicon-oxygen relative bond stability in the above-mentioned precursors (19), in a given thermal environment resulting from given inert or active pyrolysis conditions. This PA-CVD process was tested by subjecting the classes of above-mentioned various silicon-based polymers to various thermal budgets controlling the depolymerization conditions (thermal cracking, chemical decomposition and polymeric disproportionation). The deposited films can be used as active, passivation, dielectric or protective coatings for semiconductor discrete or integrated devices or implantable materials. Any combination of these categories of pure or doped materials can be deposited on metals, ceramics, glasses or plastics, in single- or multiple-layered structures, at temperatures above 300° C.

The resulting semiconductor thin film possesses highly desirable electronic, optoelectronic and photonic properties that make it highly suitable for standard, cost-effective fabrication of a variety of electronic and optoelectronic devices, including photovoltaic cells. The a-SiC thin film is an n-type and/or p-type mono or heterojunction with a donor concentration of $10^{14}$-$10^{17}$ cm$^{-3}$.

An interesting feature of the present invention is the role played by the gaseous precursors (19) from polymeric sources, in the deposition of the thin films of silicon carbide. This process is based on the polymeric source being first cracked to produce large molecular weight gaseous precursor with pre-existing silicon-carbon bonds. These provide the building blocks for the silicon carbide thin film to be deposited on the desired substrate.

Another principle of the proposed method is to create at the outset, in the gas phase, the majority of the required bonds that will constitute the solid silicon carbide. Consequently, the role of the chemical reactions occurring on the substrate is drastically limited to the completion of the remaining small number of bonds required for the silicon carbide structure. This technique permits much lower operating temperature during growth of the silicon carbide thin film than standard industrial practices. This technique facilitates a high rate of mass transfer during desublimation of the large precursor molecules, thereby increasing the growth rate of silicon carbide on the substrate. The lower operating temperature provides an environment for lowering the amount of unintentional impurities in the deposited film. Desublimation is herein defined as a change of phase from a gaseous species directly to a solid species.

The PA-CVD process takes full advantage of the Si—C and Si-N bonds pre-existing in the primary polymeric source. This invention incorporates the theoretical concept of "anti-ceramic yield" of the gaseous precursors: the traditional method for producing silicon carbide from polymeric sources is through rearrangement of the solid residue left after pyrolysis of the precursor sources, with a ceramic yield amounting to 80% solid; recent efforts are towards maximization of the amount of polymer remaining solid, thereby increasing the yield to higher values. The theory applying to the new concept generally involves the opposite: to maximize the fraction of polymer that is vaporized for the formation of the desired new gaseous precursor leading to the amorphous silicon carbide deposit, almost the entire polymer source is vaporized, with the net result that the ceramic yield is almost nil while the polymer transforms itself into a new gaseous source resulting in almost 100% anticeramic yield.

Figure 2:
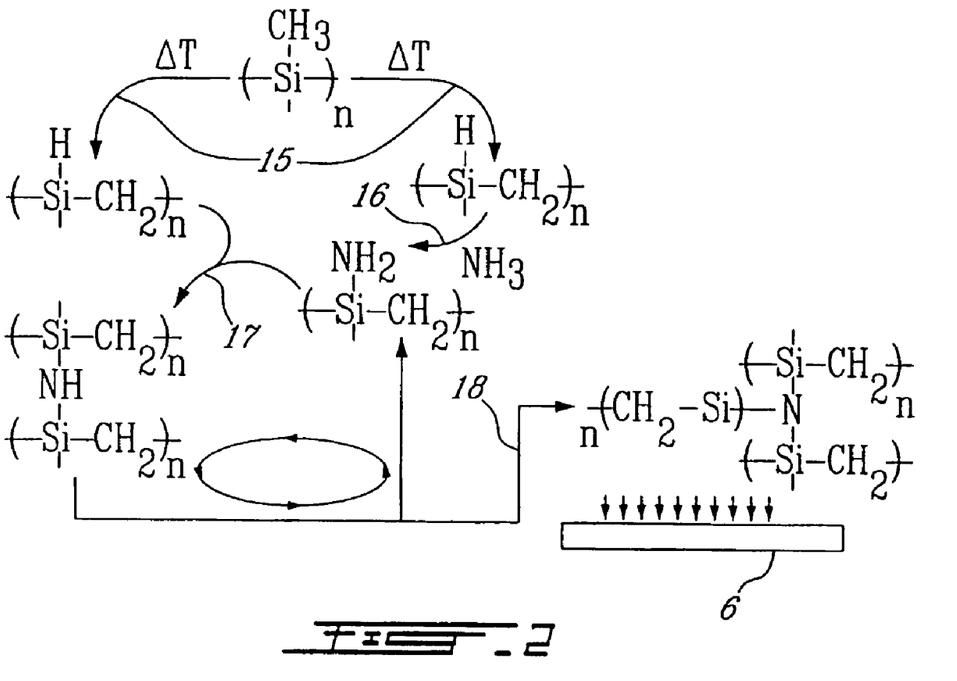
FIG. 2 is a representation of the set of chemical reactions leading to n-type a-SiC from a generic polysilane precursor (polymethylsilane, e.g.) within the reactor.

In the PA-CVD process as represented in FIG. 2, the first phase of the deposition involves significantly higher a-SiC deposition rates compared to the CVD method because of chemically-synchronized Si—C bond redistribution in organo-polysilanes. Still referring to FIG. 2, in the first chemical reaction (15), a thermally activated methylene insertion into silicon-silicon bonds takes place to produce poly(carbosilane) precursor. This intramolecular reaction, known as the Kumada rearrangement, (Shiina, K.; Kumada, M. (1958) in J. Org. Chem, 23, 139), provides the structural framework of silicon carbide, (Scarlete, M.; Brienne, S.; Butter, S. S. and Harrod, J. F. (1994), Chem. Mater., 6, 977). By simply heating the polymer precursor, a very large number of Si—C bonds are appropriately redistributed at a very fast rate.

The second reaction (16), also represented in FIG. 2, leads to the introduction of nitrogen atoms as donor impurities into the silicon carbon precursors. The formation of the aminocarbosilane precursor in reaction (16), occurs via a reaction with ammonia, found either in the atmosphere or in the polymer derived source.

While still referring to FIG. 2, the third reaction (17), results in high molecular weight species through the formation of secondary amine species, leading to increased desublimation capacity. The formation of the secondary amine species is via the Si—H/N—H dehydrogenation. The fourth reaction (18), governs the formation of the film derived from the third reaction (17) onto the substrate (6). The formation of high molecular mass ternary amine species, which are direct precursors of the n-type a-SiC film on the substrate via desublimation, with the reaction (18) presented in FIG. 2 being a transamination reaction, and this reaction being illustrative of one possible chemical mechanisms.

The temperature in the furnace varies between 100° C. and 1000° C. depending on the stage and the specific local requirements of the process steps in the aforementioned reactions. The gaseous species are monitored by FT-IR spectroscopy (7) of samples extracted near the reactor outlet (9). The a-SiC thin films can also be characterized by IR spectroscopy while the concentration of adventitious oxygen in the thin film can be measured by using a Czochralski (Scarlete, M., J. Electrochem. Soc., (1992), 139 (4), 1207), silicon window as a standard.

In this method, gaseous precursors from polymeric sources are produced first, contrary to the classical polymeric route. A definite advantage of this process is a purification that involves the polymer source during the sublimation process.

This purification occurs during PA-CVD, the effect of adventitious oxidation of the initial solid polymeric source is reduced by the decreased capacity of oxidized backbones to produce volatile material (e.g., at the limit, a high degree of oxidation produces $SiO_2$ with negligible volatility). The oxidized material is therefore concentrated in the solid residue, while the precursors reaching the substrate are purified this way. This purification helps to produce films that have very few chemical impurities and consequently fewer surface defects.

Figure 3:
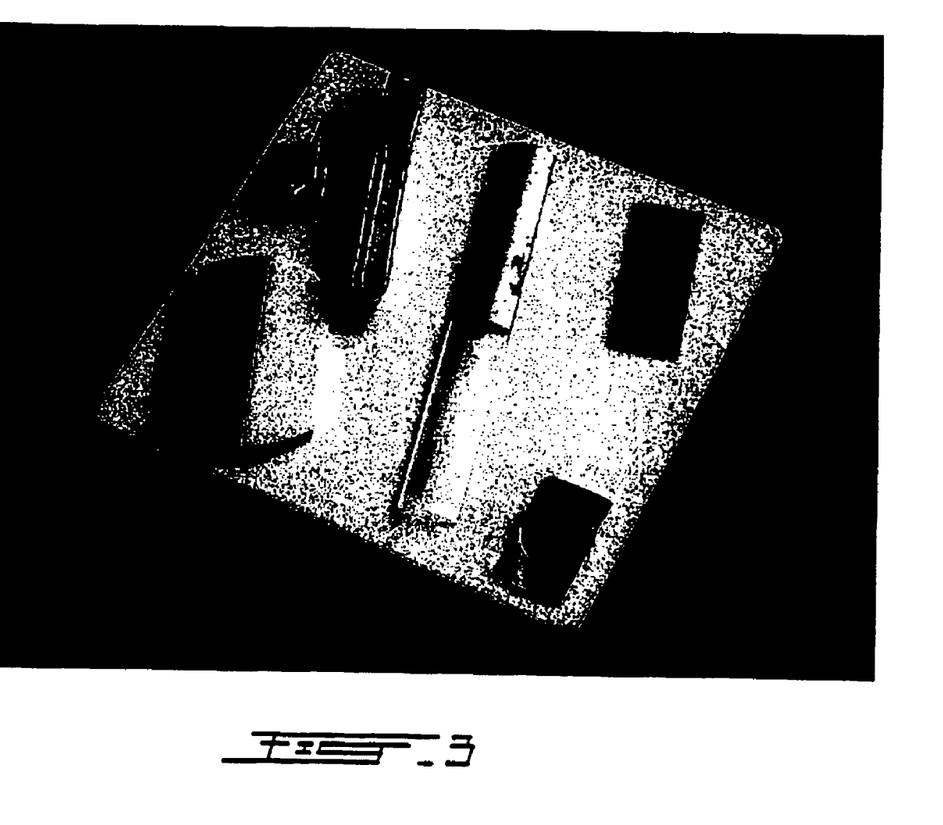
FIG. 3 is a series of various substrates supporting PA-CVD films.

FIG. 3 shows the various types of substrates that can be coated, as well as, their nature and complexity with a-SiC film deposited by the process of this invention. The a-SiC thin film can be deposited on a regular ceramic material of a complicated shape, quartz, electronic-grade sintered alumina, polished alumina, silicon single crystal wafer, graphite, and other commonly available and relatively inexpensive materials. Several of the materials have been coated with the PA-CVD method of the invention on one side (the dark surface) while the other side was masked during deposition and the mask removed leaving the pale surface which can also be seen in FIG. 3. Therefore, the PA-CVD method is also compatible with conventional techniques such as masking understood by those skilled in the art.

Figure 4:
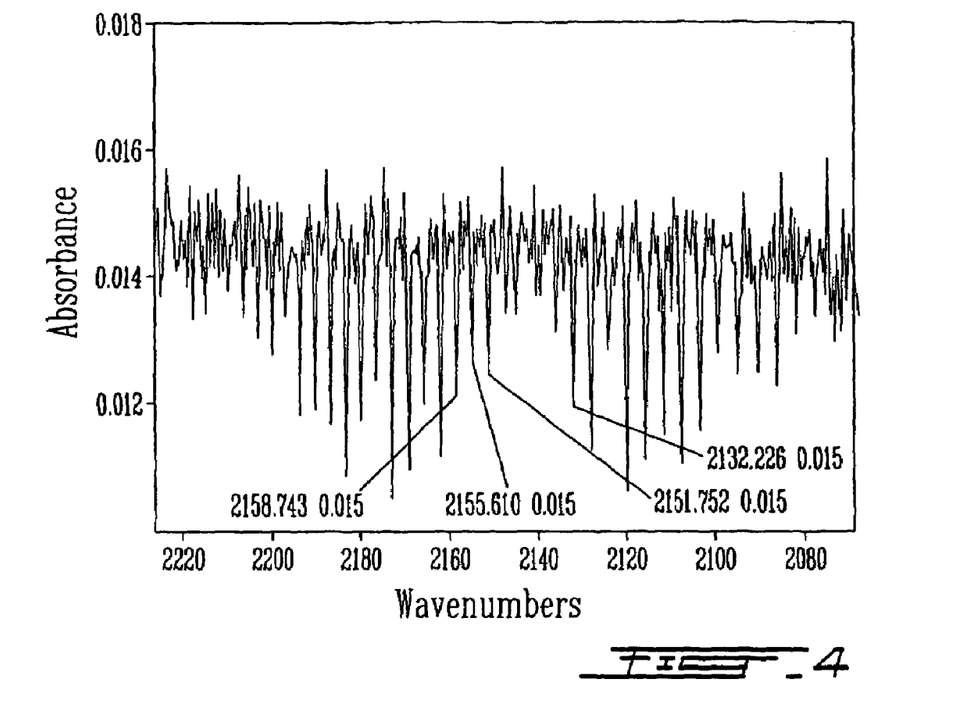
FIG. 4 illustrates an infrared spectrum of a gaseous precursor formed during deposition of a-SiC PA-CVD films.

Referring to FIG. 4, the in situ FT-IR spectrum analysis of a gaseous precursor at the outlet (9), of the reactor (2), shows the numerous peaks that correspond to the SiH bonds formed when chemical change in the structure of the solid polymeric source produces a polymer derived precursor (19). The increasing temperature near the inlet of the reactor (2), breaks down the polymeric source into various subunits to produce the gaseous precursor (19).

Figure 5:
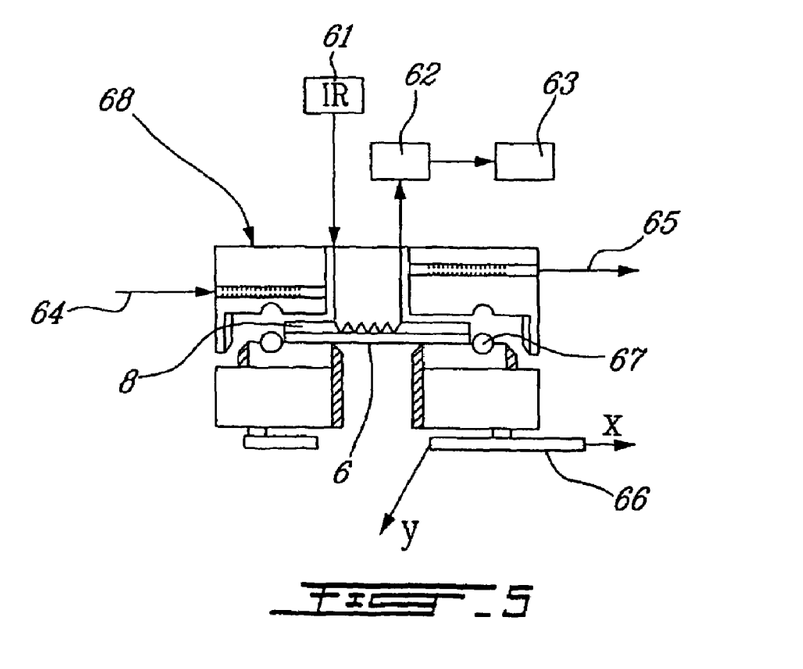
FIG. 5 is a design of the FT-IR cell based on a silicon single crystal wafer, designed for the monitoring of a film produced by the PA-CVD process.

Referring to FIG. 5, where there is represented a schematic of FT-IR cell based on a silicon single crystal wafer (68), which is designed for the monitoring of a PA-CVD film (8) deposited on a substrate (6) by the process of the invention. The substrate (6) with a coating (8) is held in place, the thickness of the deposited layer has been exaggerated so that the upper half and lower half of the FT-IR cell actually sit one on top of the other and are sealed by the represented O-ring (67). There is a protective gas swept through the FT-IR cell from an inlet (64) to an outlet (65), which maintains the appropriate inert atmosphere. The IR beam (61) is projected onto the substrate and it is bent and reflected through the deposited film (8), and then collected through a microscope objective (62) and detected by a MCT (mercury-cadmium-tellurium, Hg-Cd-Te) detector (63). The FT-IR cell is mounted on an adjustable 2D micrometric stand (66) which allows the FT-IR to be adjusted appropriately with respect to the IR beam (61).

Figure 6:
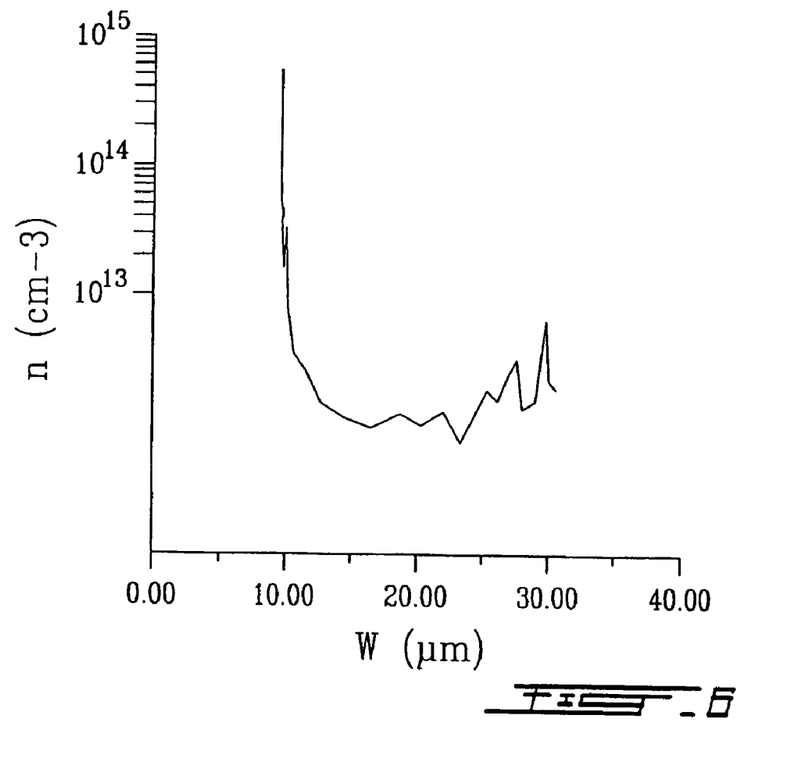
FIG. 6 illustrates the carrier properties of the n-type PA-CVD deposited a-SiC film.

Referring to FIG. 6, the carrier properties of an n-type PA-CVD film produced are represented. The graph represents the donor concentration, n ($cm^{-3}$) versus the width of the depletion zone, w (μm). We observe that the sample tested has a low donor concentration which can be below $10^{13}$ but range to $10^{15}$ $cm^{-3}$ in the of the graph. A preferred range that is less than $10^{14}$ $cm^{-3}$. These low donor level values are before any doping. The width of the depletion zone (W) which is measured in (μm) is a function of the material connected at the junction, in the case of FIG. 6, that of an n-type film with the substrate. W must not be confused with the film thickness. Thicker films (above 20 μm) were required for the method of detection used to quantify the carrier concentration in the depletion zone, and the thin films obtained by this method (100 Å to 0.1 μm) will have the same type of curve as found in FIG. 6, at the far lower thicknesses.

Figure 7:
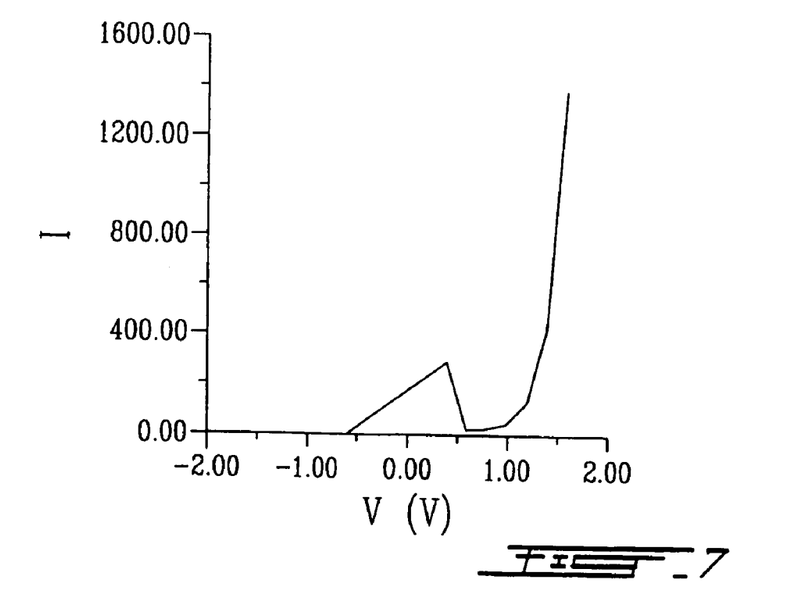
FIG. 7 illustrates the semiconductor properties of the n-type PA-CVD deposited a-SiC film.

FIG. 7 represents the semiconductor properties of an n-SiC PA-CVD film which is a qualitative indication of the quality of the film, indicated by the curve of current versus voltage.

Figure 8:
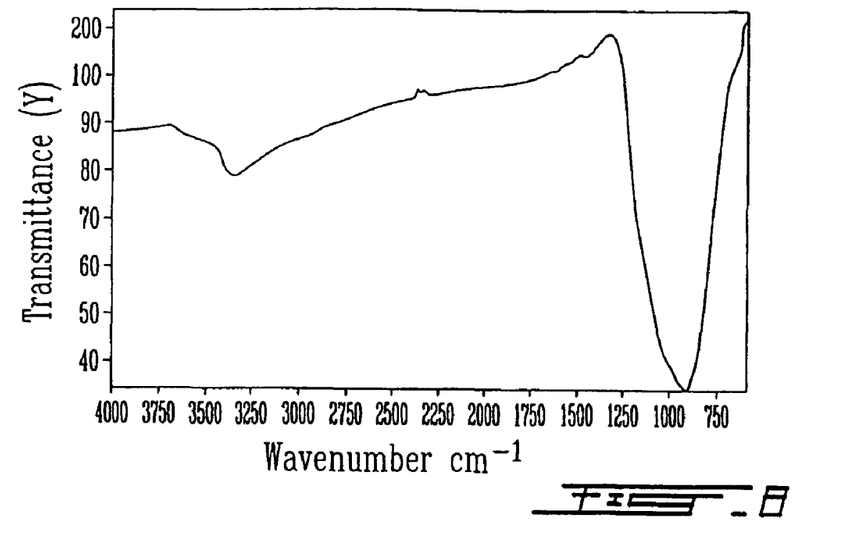
FIG. 8 illustrates the FT-IR spectrum a silicon nitride PA-CVD deposited film.

Referring to FIG. 8, there is represented an FT-IR spectrum of a PA-CVD film of deposited silicon nitride. The main peak around 800 $cm^{-1}$ being that of Si—N.

Figure 9:
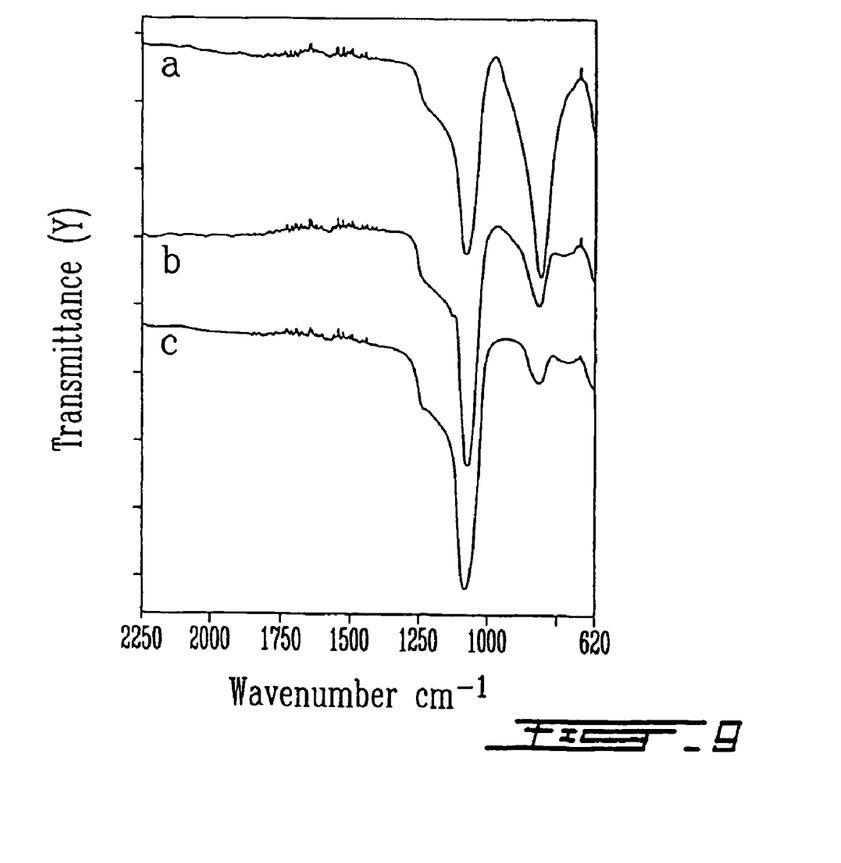
FIG. 9 illustrates the FT-IR spectrum a silicon oxycarbide PA-CVD synthesized film.

Referring to FIG. 9, which represents the FT-IR spectrum of PA-CVD films of a synthesized silicon oxycarbide with each of the three samples (a), (b) and (c) exposed to a temperature maximum of 1100° C. but annealed for the progressively increasing time periods of 8, 16 and 24 hours respectively. It must be noted, that the interstitial oxygen peak found in sample (a) at approximately 1100 cm−1, increases as the film is annealed for longer periods. This indicates the conversion limited resistance of the film to oxidation.

Figure 10:
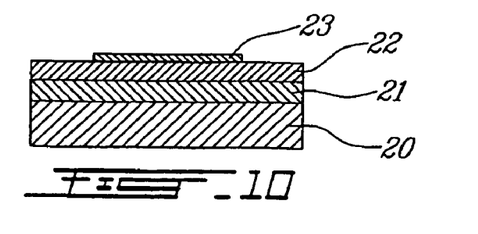
FIG. 10 illustrates a simple Schottky solar cell.

Referring to FIG. 10, there is represented a simple Schottky solar cell. The cell comprises one layer only of a-SiC (22), a metallic substrate (20) acting as anode (when layer (22) is n-type) or cathode (when layer (22) is p-type). The suitable metal is an inexpensive conductive material and its thickness or uniformity of thickness is not critical (viz. aluminum foil). The ohmic contact layer (21) deposited by physical evaporation or other physico-chemical means, providing effective contact with the overlying semiconductor layer as well as the underlying metallic substrate, consisting of aluminum or similar conductor (200 nm) if n-type, or aluminum/nickel (100 nm/100 nm) if p-type; the surface of which must be cleaned by chemical etching or mechanical means to avoid oxidation with respect to layer (22). Alternatively, layers (21) and (22) could be made or fabricated as one composite layer over which layer (22) could be deposited. The semiconductor layer of a-SiC of n- or p-type (22), with free carrier density between $10^{14}$ and $10^{17}$ cm$^{-3}$, of 0.2 to 1 μm thickness, being the critical element resulting from the PA-CVD process and acting as the heart of the cell, with the upper free carrier capacity being a critical factor. The top layer gold (Au) layer (23) of 5 to 10 nm thickness, acting as cathode if the semiconductor is n-type or as anode if it is p-type. The gold deposited mechanically or chemically onto n-type semiconductor. The gold layer is sufficiently thin as to allow light to reach the semiconductor.

Figure 11:
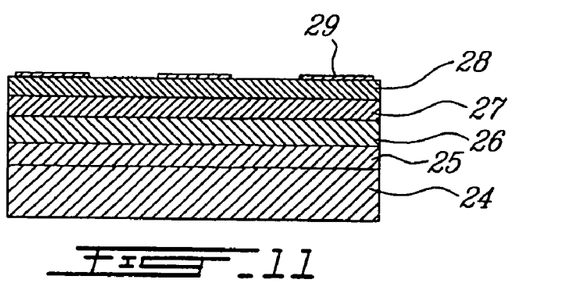
FIG. 11 is a p-n junction barrier photovoltaic cell based on a-SiC.

FIG. 11 is a p-n junction barrier photovoltaic cell based on a-SiC with the multiple layers produced by the process of the invention. In this photovoltaic cell, a metallic substrate is acting as an anode (24). Layer (25) is a metallised (aluminum) ohmic contact layer (~100 nm). These layers are followed by an n-type a-SiC (~750 nm) layer (26), p-type a-SiC (~250 nm) layer (27), a nickel ohmic layer (28) and an aluminum top contact layer (29) serving as cathode which covers approximately 10 percent of illuminated surface.

Figure 12:
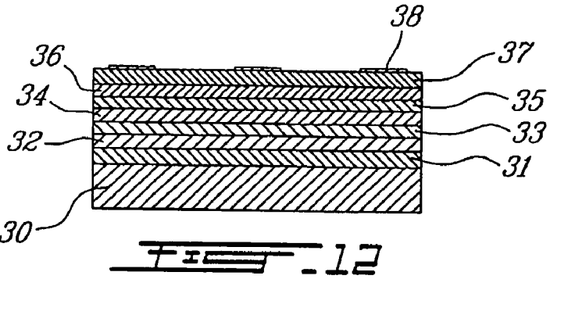
FIG. 12 illustrates a stacked p-n junction solar cell.

FIG. 12 represents a stacked p-n junction solar cell, the multiple layers produced by the method of the invention. The layers of FIG. 12 (with reference numbers followed by the layer thicknesses, listed from bottom to top) are: (30) metallic substrate acting as cathode; (31) aluminum-nickel ohmic contact layer (~100 nm/~100 nm); (32) p-type a-Ge layer (~200 nm); (33) n-type a-Ge layer (~200 nm); (34) p-type a-Si (~200 nm); (35) n-type a-Si (~200 nm); (36) p-type a-SiC (~200 nm); (37) n-type a-SiC (~200 nm); and (38) top aluminum anode contact, covering about 10 percent of the surface.

Figure 13A:
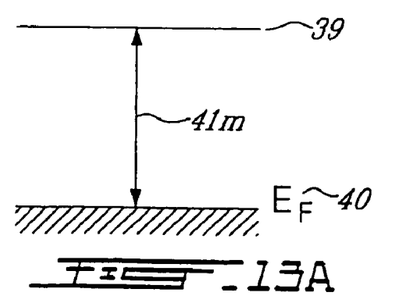
FIG. 13a illustrates an energy band diagram of Schottky structure before intimate contact between metal and semiconductor.
Figure 13B:
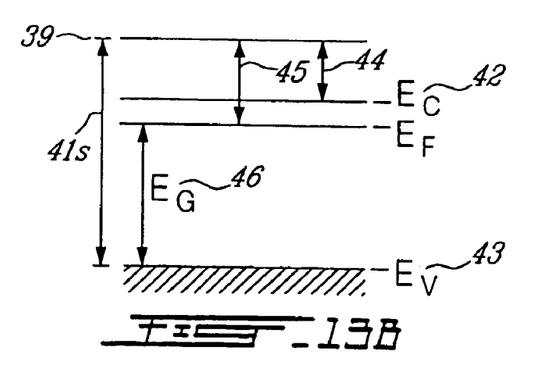
FIG. 13b illustrates an energy band diagram of Schottky structure after intimate contact between metal and semiconductor.
Figure 14A:
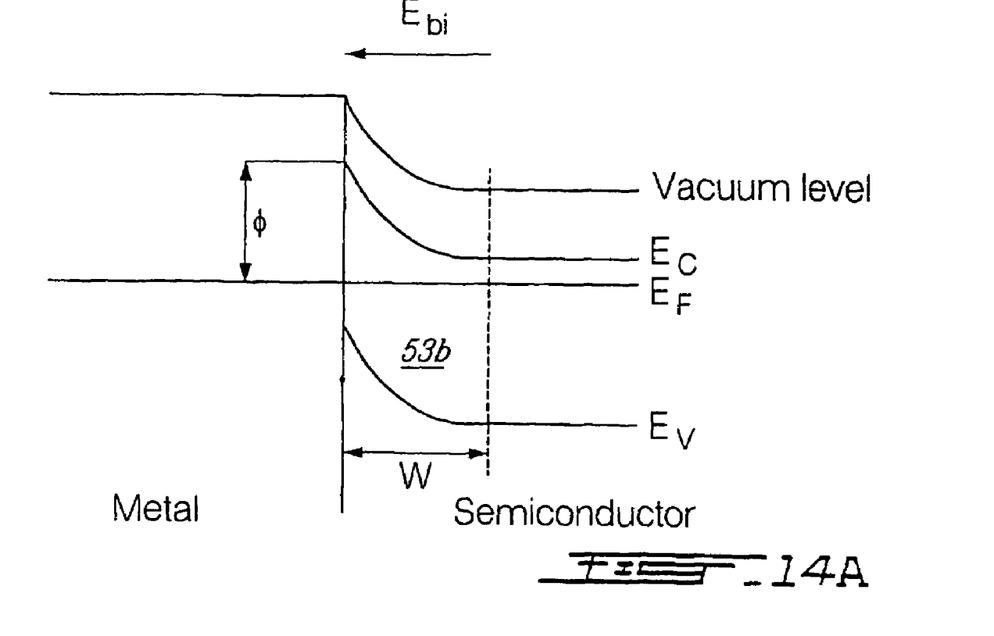
FIGS. 14a and 14b illustrates the energy band of a p-n junction solar cell.
Figure 14B:
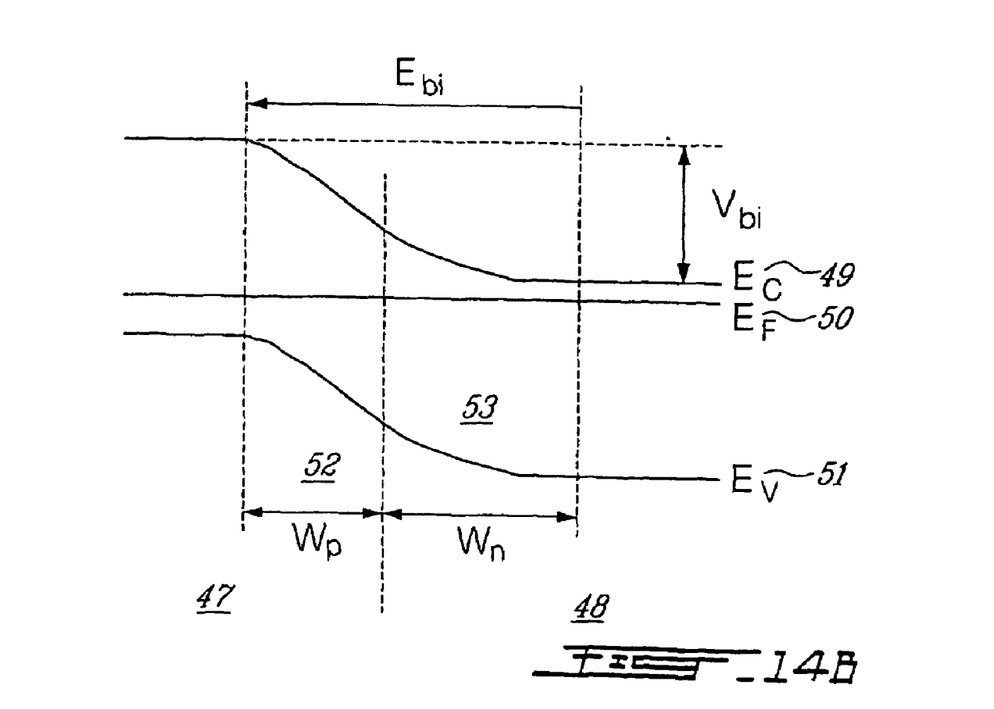

In any semiconductor junction, such as in a Schottky junction shown FIG. 13$b$ or a p-n junction such as shown in FIG. 14B, there is an internal electrical field, $E_{bi}$, called "built-in electrical field", that prevents the charge carriers (electrons and holes) to stay in the a region of the material called the "depleted zone." If the depletion region of thickness W, is illuminated by photons with energies greater than ($E_c$-$E_v$), this region develops pairs of "electron-hole" which are separated by the internal electrical field: the electrons are attracted towards the semiconductor while holes are directed towards the metal, creating a photocurrent when the device is connected to an external load. The structure is called a photovoltaic cell or solar cell.

The current generated in an amorphous semiconductor is mainly due to a drift component, because the diffusion component is not significant due to low mobilities of the charge carriers. In order to collect efficiently the photon energies in an amorphous semiconductor junction, the depleted region width must be as large as possible. The depleted zone width, W, is given by:

$$W = (\epsilon V_{bi}/q N_D)^{1/2}$$

where ε is the dielectric constant of the semiconductor, q is the electron charge, $N_D$ is the electron concentration, and $V_{bi}$ is the built-in voltage given by:

$$V_{bi} = (\Phi_B - (E_C - E_F))$$

The width of the depletion region can be increased by lowering the free carrier concentration of the material.

If a p-n junction (FIG. 14) is used instead of a Schottky one, the depletion region width can be increased (in this case, each type of material has its own depleted zone), therefore increasing the efficiency of the photovoltaic cell.

In the Schottky structure (FIG. 11), the energy band diagram is shown in FIG. 13B before the intimate contact between the metal and the semiconductor. The work function, $\Phi_s$ (41$s$) is the energy difference between the vacuum level (39) and the Fermi level, $E_F$ (40). The vacuum level (39) is the zone where the electron is free from the semiconductor atoms and has no kinetic energy. In elemental solids such as a metal, represented in FIG. 13A, the values of the work function $\Phi_m$ (41$m$) are well established, (see for example Weast, R. C. (1990), CRC Handbook of Chemistry and Physics, 70th Edition, CRC Press, E-93).

FIG. 13B illustrates the work function of a semiconductor (41$s$) normally denoted by $\Phi_s$. The energy difference between the vacuum level (39) and the bottom of the conduction band (42), denoting electron affinity (χ), is used as reference since the Fermi level depends on the carrier concentration in the semiconductor. However, $\Phi_s$ still represents the energy required to remove an electron from the semiconductor. Referring to FIG. 10 and 13B, the conduction level (42) $E_c$, the valence level (43) $E_v$; the affinity (44) $\chi$; the work function (45) $\Phi_s$; and the energy gap (46) $E_G$ are of the semiconductor layer (22).

The Fermi level represents the energy for which the probability to find a free electron, in equilibrium and near zero Kelvin equals 0.5. The probability of finding an electron at a given energy level is obtained according to the Fermi-Dirac function:

$$F(E) = 1 \div [1 + \exp{(E - E_F)/kT}]$$

The Fermi level in a semiconductor depends on the free carrier concentration, and it is closer to the conduction band than the valence band in n-type semiconductor. Assuming that ($\Phi_m > \Phi_s$), and that the metal-semiconductor system at equilibrium of FIG. 14A, the Fermi level is at the same both in the metal and the semiconductor. Therefore, an internally built-in electric field ($E_{bi}$) develops between the metal and the semiconductor. The field is oriented from the positive charges to the negative charges, that is, towards the metal. The resulting built-in voltage is equal to [($\Phi m - \Phi s$)/q]. A depletion layer, of thickness W (53$b$), is formed where there are no free charges. The potential energy barrier for electrons moving from the metal to the semi-conduction is known as the Schottky barrier height, $\Phi_B$, and is given by: ($\Phi_B = (\Phi_m - \chi)$). Under reverse bias or zero bias electrical conditions, there is no net current flowing through the metal-semiconductor junction.

For photon energies greater than $E_G$; the electron-hole pairs are generated in the depleted zone.

In the p-n structure of FIG. 14B, where the p-type a-SiC (47) and the n-type a-SiC (48) are represented. The principal electronic phenomena takes place in the depleted zones (52) and (53). In this case, the built-in voltage $V_{bi}$ depends on the carrier concentration in the semiconductor:

$$V_{bi} = (kT/q) Ln(N_A N_D / n_i^2)$$

where k is the Boltzmann constant, T the temperature, $N_A$ the hole concentration and $n_i$ the intrinsic carrier concentration.

The depletion region widths are given by:

$$W_n = (\epsilon V_{bi}/q N_D)^{1/2}$$

$$W_p = (\epsilon V_{bi}/q N_A)^{1/2}$$

With the conduction level (49) $E_c$, the Fermi Level (50) $E_F$ and the valence level (51) also represented in FIG. 14B.

The examples selected below present tailored PACVD processes for the use of some of the mentioned polymers in the synthesis of the previously mentioned materials.

EXAMPLE 1

Use of Polysilanes as PA-CVD Precursors to n-type Semiconductor a-SiC.

The anticeramic yield is optimized with respect to the average molecular weight and the polydispersity of the polysilane raw material. In the first step, an appropriate time-dependent temperature gradient is programmed in the furnace, so that quantitative polycarbosilane formation is promoted. Possible ranges for the gradients are 1-10 Kmin$^{-1}$ and 3-50 Kcm$^{-1}$ in a 2 inch/150 cm horizontal quartz reactor (11). A second step involves polycarbosilane pyrolysis that may be coupled with a nitrogen-doping process, via a carefully monitored (flow, pressure (3), and FT-IR (7)) reaction with electronic-grade ammonia (12), at a partial pressure level of 10$^{-6}$-10$^{-1}$ torr in a UHP-Ar (or N$_2$) carrier flow. The resulting polymeric gaseous species (17,18) are transported in the deposition zone (13), where they are desublimed onto the substrate (6) that can be placed in a horizontal, vertical or a tilted position, and can be mobile or immobile during the deposition. The resulted material is an n-type a-SiC with a donor concentration in the range of 10$^{14}$-10$^{17}$ cm$^{-3}$. The thickness of the resulted film can be adjusted in the 100 Å-1 μm range, via single/multiple layered deposition.

EXAMPLE 2

Use of Polysilanes as PA-CVD Precursors for the Synthesis of Thin Films of Passivating SiO$_x$C$_y$-Glasses Silicon oxycarbide (SiO$_x$C$_y$) is an amorphous metastable phase wherein the silicon atoms are bonded to oxygen and carbon simultaneously. In silicon oxycarbides, high temperature properties and chemical stability have been reported, exceeding those of ordinary vitreous silica. Silicon oxycarbide materials have also the potential for use in a variety of protective applications within the semiconductor industry. Using PA-CVD technique, silicon oxycarbides of various compositions have been deposited on highly resistive single crystal silicon wafers, using different conditions to vary the oxygen content in the films. The anticeramic yield is optimized with respect to the average molecular weight and the polydispersity of the polysilane raw material.

In the first step, an appropriate time-dependent temperature gradient is programmed in the furnace to enhance quantitative polycarbosilane formation. Possible ranges for the gradients are 1-10 Kmin$^{-1}$ and 3-50 Kcm$^{-1}$ in a 2 inch/150 cm horizontal quartz reactor (11). The resulted polymeric gaseous species (17,18) are transported in the deposition zone (13).

A third step involves polycarbosilane controlled oxidation process, via a carefully monitored [(flow, pressure (3), and FT-IR (7)] reaction with oxygen carrying species including, but not limited to, 0$_2$, 0$_3$, CO (zone 12, FIG. 1), at a partial pressure level of 10$^{-4}$-10−1 torr in a UHP-Ar (or N$_2$) carrier flow. The oxygen carrying species are introduced directly in the deposition zone (13).

The controlled oxidation products are desublimed onto the substrate (6), that can be placed in a horizontal, vertical or a tilted position, can be mobile or immobile during the deposition. The resulted material is a SiO$_x$C$_y$ glass with an oxygen content in the range from x=10$^{-3}$ to x=1.3 (measured using an external standard of Cz-silicon single crystal via ASTM F-1188). The thickness of the resulted film can be adjusted in the 100 Å-1 μm range, via single/multiple layered deposition.

EXAMPLE 3

Use of Polysilanes as PA-CVD Precursors to Dielectric or Passivating a-Si$_x$N$_y$ Thin Films The anticeramic yield is optimized with respect to the average molecular weight and the polydispersity of the polysilane raw material. An appropriate time-dependent temperature gradient is programmed in the furnace, so that quantitative polysilazane formation is promoted. Possible ranges for the gradients are 1-5° K. min$^{-1}$ and 3-50° K. cm$^{-1}$ where the temperature increases (11) in a 2 inch/150 cm horizontal quartz reactor (2). A second step involves pyrolysis of the polysilazane in the reaction zone (12) in FIG. 1 where the temperature is relatively constant. This step may be optionally followed by a transamination processes induced directly in the deposition zone (13), via a carefully monitored (flow, pressure—parameters (3) and PID temperature parameters (5) where P=1-25, I=10-250, and D=0.1-10) reaction under pure electronic-grade gaseous ammonia introduced in the temperature zone (11), FIG. 1b, at a pressure level of 1-50 torr over the atmospheric pressure. The resulted precursor gaseous species (17,18) are transported in the deposition zone (13), where they are desublimed onto the substrate (6), that can be placed in a horizontal, vertical or a tilted position, can be mobile or immobile during the deposition. Function of the parameters mentioned above, the resulted material is a-Si$_x$N$_y$, with a x/y ratio in the range of 0.75 to 1. The thickness of the resulted film can be adjusted in the 100 Å-1 μm, via single/multiple layered deposition.

EXAMPLE 4

Measurement of Free-charge Carrier Concentration of n-type a-SiC Films

The free-charge carriers in n-type semiconductor a-SiC films are measured by the capacitance-voltage (CV) method (Schroder. D. K. (1990), Semiconductor Materials and Device Characterization, Wiley Interscience p. 41) using the Schumberger impedance analyzer Solartron 3200. The voltage is varied between −6 and 0 V, and the resulting capacitance is observed to increase with increasing voltages. On sample 01-S0001, six Schottky diodes are fabricated using mercury as anode metal: the mercury probe used provides a diode area of 0.453 mm$^2$. The capacitance is given by:

$$C = \epsilon A/w$$

where A is the diode area. In the presence of an applied voltage V, the depletion region width is given by:

$$W = ((\epsilon(V_{bi}-V))/q\, N_D)^{1/2}$$

The derived values for $N_D$ (electron concentration) in the diodes are $9\,10^{17} \pm 0.2\,10^{17}$ cm$^{-3}$.

EXAMPLE 5

Measurement of Electron Mobilities in n-type a-SiC Films

The electron mobilities are measured in three samples 21/NO/2001/05, 06 and 07, using the Van der Pauw method (Van der Pauw, L. J. (1958), A method of measuring specific resistivity and Hall coefficient on lamellae of arbitrary shape, Phil. Tech. Rev., vol. 20, p.220). The measured mobilities are defined as Hall mobilities because the technique is based on the Hall effect. The measurements are carried out with a current of 1 mA, and a magnetic field of 5 kG. The correction factors f derived for the three samples are 0.99, 0.67, and 0.86, respectively. The derived resistivities are 29.75, 22.32 and 17.24 $\Omega cm^{-1}$, and the derived mobilities are 6.72, 4.48 and 23.19 $cm^2V^{-1}s^{-1}$, and the electron concentrations in the samples are calculated using the resistivity and mobility as: $3.12\times10^{16}$, $6.25\times10^{16}$, and $1.56\times10^{16}$ cm3, respectively.

The above description and drawings are only illustrative of preferred embodiments which achieve the objects, features and advantages of the present invention, and it is not intended that the present invention be limited thereto. Any modification of the present invention that comes within the spirit and scope of the following claims is considered part of the present invention.

The invention claimed is:

1. A method of depositing a thin ceramic film onto a substrate comprising:
   providing a polymeric source selected from the group consisting of a boron nitride polymer, a carbon nitride polymer, a polysilane, a polycarbosilane, a polycarbosilazane or a polysiloxazane, the polymeric source comprising chains,
   volatilizing the polymeric source in a heating zone;
   providing the substrate in a deposition zone;
   heating the polymeric source under a gaseous atmosphere having a pressure and a flowrate in a pyrolysis zone, whereby pyrolyzing the polymeric source to produce a gaseous precursor at a first temperature comprising said chains of the polymeric source;
   positioning the substrate in the deposition zone to receive the gaseous precursors carried by the gaseous atmosphere; and
   cooling the substrate at a second temperature in the deposition zone below the first temperature whereby desublimating the gaseous precursor onto the substrate, the precursor chemically rearranging and annealing to produce the film on the substrate, the film having properties that include an amorphous nature, a crystallinity and a degree of reticulation.

2. The method according to claim 1, wherein the polymeric source is a silicon-based polymer.

3. The method according to claim 1 wherein the polymeric source comprises Si, C, N or O substituents.

4. The method according to claim 1, wherein the film has a thickness of at least 100 Å.

5. The method according to claim 1, further comprising a second annealing with a gaseous reactant wherein at least one of the crystallinity or the degree of reticulation is increased.

6. The method according to claim 1, wherein the film produced is a semiconductor film where a donor concentration is less than $10^{15}$ $cm^{-3}$ in a depletion zone next to the substrate prior to doping.

7. The method according to claim 6, wherein the donor concentration is in a range from $10^{13}$ to $10^{15}$ $cm^{-3}$ in the depletion zone prior to doping.

8. The method according to any claim 1, wherein the heating of the polymeric source is performed by a technique selected from the group consisting of electrical heating, UV irradiation, IR irradiation, microwave power, X-ray irradiation, electronic beams and laser beams.

9. The method according to claim 1, wherein the gaseous atmosphere is one of an inert atmosphere and the inert atmosphere in a mixture including a gaseous reactant.

10. The method according to claim 9, wherein the inert atmosphere is selected from Ar and $N_2$.

11. The method according to claim 9, wherein the gaseous reactant is selected from the group consisting of $BH_3$, $B_2H_6$, $NH_3$, $PH_3$, $AsH_3$, $BCl_3$, $B_2Cl_6$, $NCl_3$, $PCl_3$, $AsCl_3$, $CO$, $O_2$, $O_3$, $CO_2$, and $H_2$ pure or in a mixture with the inert atmosphere.

12. The method according to claim 1, wherein the substrate is selected from the group consisting of single crystal silicon, polycrystalline silicon, amorphous silicon, quartz, graphite, electronic-grade ceramic material, refractive ceramic material, metal, alumina, sintered oxides, sintered nitrides and sintered phosphides.

13. The method according to claim 1, wherein the first temperature is a maximum of 1000° C. and the second temperature is at least 100° C.

14. The method according to claim 13, wherein the first temperature is a maximum of 450° C. and the second temperature is at least 200° C.

15. The method according to claim 1, wherein the polymeric source is transported through a gas inlet by the gaseous atmosphere.

16. The method of according to claim 2, wherein the silicon-based polymer further comprises pre-existing SiC bonds that will develop a set of gaseous precursors at the first temperature with the Si—C bonds thermodynamically stable.

17. The method according to claim 16, wherein more than 50% of the SiC bonds pre-exist in the specific set of gaseous precursors.

* * * * *